United States Patent
Lee et al.

(10) Patent No.: US 10,367,046 B2
(45) Date of Patent: Jul. 30, 2019

(54) ORGANIC LIGHT-EMITTING DISPLAY DEVICE AND METHOD OF MANUFACTURING THE SAME

(71) Applicant: LG Display Co., Ltd., Seoul (KR)

(72) Inventors: Eun-Hye Lee, Paju-si (KR); Tae-Hwan Kim, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 15/797,720

(22) Filed: Oct. 30, 2017

(65) Prior Publication Data
US 2018/0122882 A1 May 3, 2018

(30) Foreign Application Priority Data
Oct. 31, 2016 (KR) .................. 10-2016-0143901

(51) Int. Cl.
*H01L 27/32* (2006.01)
*H01L 51/52* (2006.01)
(Continued)

(52) U.S. Cl.
CPC ...... *H01L 27/3258* (2013.01); *H01L 27/1248* (2013.01); *H01L 27/3246* (2013.01); *H01L 27/3248* (2013.01); *H01L 27/3276* (2013.01); *H01L 51/5228* (2013.01); *H01L 51/56* (2013.01); *H01L 2227/323* (2013.01)

(58) Field of Classification Search
CPC ............. H01L 27/3246; H01L 27/3258; H01L 27/1248; H01L 51/56; H01L 27/3248
See application file for complete search history.

(56) References Cited

U.S. PATENT DOCUMENTS

2011/0316007 A1* 12/2011 Sagawa ............... H01L 27/3246 257/88
2014/0183501 A1* 7/2014 Kim ................... H01L 27/3246 257/40
(Continued)

FOREIGN PATENT DOCUMENTS

| KR | 10-2014-0080231 A | 6/2014 |
| KR | 10-2014-0085326 A | 7/2014 |
| KR | 10-2015-0066428 A | 6/2015 |

OTHER PUBLICATIONS

Korean Office Action dated Oct. 10, 2018 for Korean Application No. 10-2016-014390, (with machine translation) 13 pages.

*Primary Examiner* — Selim U Ahmed
*Assistant Examiner* — Evan G Clinton
(74) *Attorney, Agent, or Firm* — Seed IP Law Group LLP

(57) ABSTRACT

Disclosed are an organic light-emitting display device and a method of manufacturing the same. In the organic light-emitting display device, a first protrusion is provided to protrude from a planarization layer, which has a pixel contact hole configured to expose a thin-film transistor disposed on a substrate, toward a cathode electrode of an organic light-emitting element, and a side surface angle of the first protrusion differs from a side surface angle of the planarization layer, which is exposed through the pixel contact hole. Thereby, the cathode electrode and an auxiliary connection electrode may be electrically connected to each other without a separate partition, which may simplify the structure and the manufacturing process of the organic light-emitting display device.

22 Claims, 13 Drawing Sheets

(51) Int. Cl.
*H01L 27/12* (2006.01)
*H01L 51/56* (2006.01)

(56) References Cited

U.S. PATENT DOCUMENTS

| | | | |
|---|---|---|---|
| 2016/0079334 A1* | 3/2016 | Lee | H01L 27/3258 |
| | | | 257/40 |
| 2016/0163769 A1* | 6/2016 | Lee | H01L 51/5209 |
| | | | 257/40 |
| 2017/0141169 A1* | 5/2017 | Sim | H01L 51/56 |
| 2017/0141172 A1* | 5/2017 | Cho | H01L 51/56 |
| 2018/0047941 A1* | 2/2018 | Kato | H01L 51/5253 |

* cited by examiner

EXPOSURE/ DEVELOPING

EXPOSURE/
DEVELOPING

ORGANIC LIGHT-EMITTING DISPLAY DEVICE AND METHOD OF MANUFACTURING THE SAME

This application claims priority from and the benefit of Korean Patent Application No. 10-2016-0143901, filed on Oct. 31, 2016, which is hereby incorporated by reference in its entirety as if fully set forth herein.

BACKGROUND

Technical Field

The present disclosure relates to an organic light-emitting display device and a method of manufacturing the same, and more particularly, to an organic light-emitting display device, which may simplify a structure and a manufacturing process thereof, and a method of manufacturing the same.

Description of the Related Art

An image display device, which realizes various pieces of information on a screen, is a core technology of the information and communication age, and is being developed in the direction of becoming thinner, lighter, more portable, and having higher performance. Representative display devices include, for example, a liquid crystal display (LCD) device and an organic light-emitting diode (OLED) display device.

In order to manufacture such a display device, a mask process using a photo-mask is performed multiple times. Each mask process involves subsidiary processes such as, for example, cleaning, exposure, developing, and etching. Thus, whenever another mask process is added, the manufacturing time and the manufacturing cost required for manufacturing an organic light-emitting display device increase and the incidence of defects increases, causing a lower production yield. Therefore, there is a demand for methods to reduce the number of mask processes in order to reduce the manufacturing cost and to increase the production yield and the production efficiency.

BRIEF SUMMARY

Accordingly, the present disclosure is directed to an organic light-emitting display device and a method of manufacturing the same that substantially obviate one or more problems due to limitations and disadvantages of the related art.

An embodiment of the present disclosure is to provide an organic light-emitting display device, which may simplify a structure and a manufacturing process thereof, and a method of manufacturing the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, in an organic light-emitting display device and a method of manufacturing the same according to the present disclosure, a first protrusion is provided to protrude from a planarization layer, which has a pixel contact hole configured to expose a thin-film transistor disposed on a substrate, toward a cathode electrode of an organic light-emitting element, and a side surface angle of the first protrusion differs from a side surface angle of the planarization layer, which is exposed through the pixel contact hole, so that the cathode electrode and an auxiliary connection electrode may be electrically connected to each other without a separate partition, which may simplify the structure and the manufacturing process of the organic light-emitting display device.

It is to be understood that both the foregoing general description and the following detailed description of the present disclosure are examples and explanatory and are intended to provide further explanation of the invention as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Hereinafter, example embodiments of the present disclosure will be described with reference to the accompanying drawings.

Figure 1:
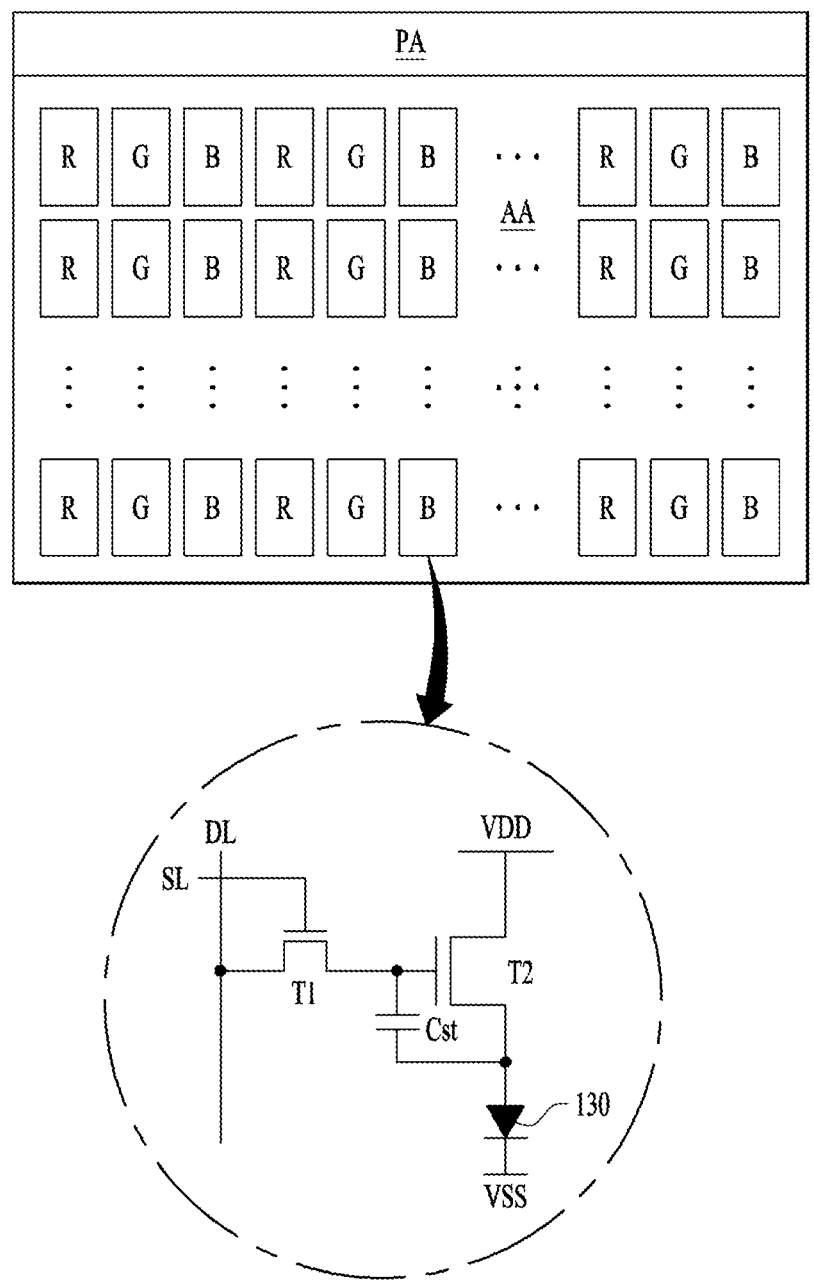
FIG. 1 is a plan view illustrating an organic light-emitting display device according to a first embodiment of the present disclosure.
Figure 2:
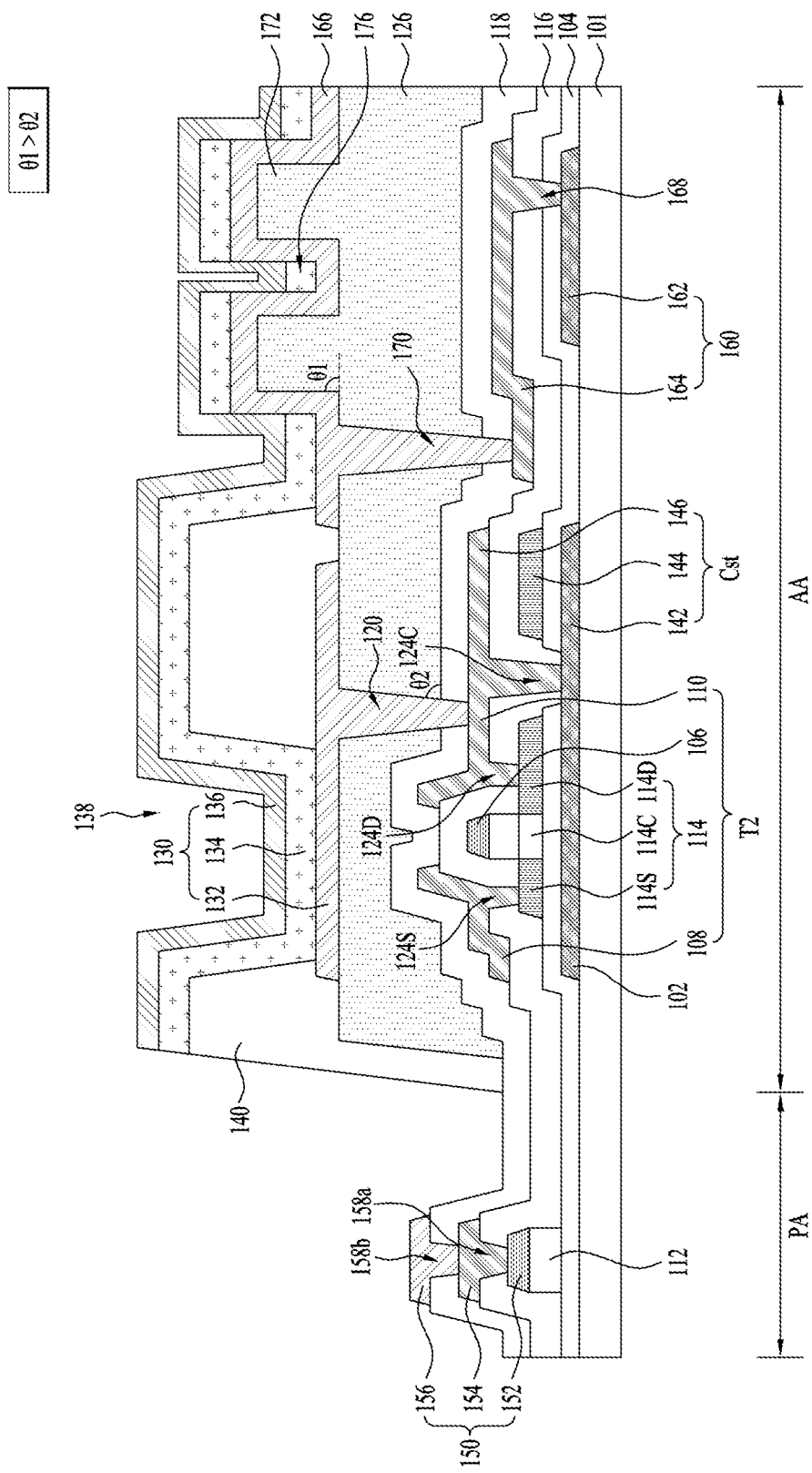
FIG. 2 is a cross-sectional view illustrating the organic light-emitting display device illustrated in FIG. 1.

FIG. 1 is a plan view illustrating an organic light-emitting display device according to a first embodiment of the present disclosure, and FIG. 2 is a cross-sectional view illustrating the organic light-emitting display device illustrated in FIG. 1.

The organic light-emitting display device illustrated in FIGS. 1 and 2 includes an active area AA and a pad area PA.

In the pad area PA, a plurality of pads 150 is formed to supply driving signals to each of a scan line SL, a data line DL, a high-voltage VDD supply line, and a low-voltage VSS supply line 160, which are arranged in the active area AA.

Each of the pads 150 includes a pad lower electrode 152, a pad intermediate electrode 154, and a pad upper electrode 156.

The pad lower electrode 152 is formed on a gate insulation pattern 112, which has the same shape as the pad lower electrode 152, using the same material as a gate electrode 106.

The pad intermediate electrode 154 is formed on an interlayer insulation layer 116 in the same layer as source and drain electrodes 108 and 110 using the same material as the source and drain electrodes 108 and 110. The pad intermediate electrode 154 is electrically connected to the pad lower electrode 152, which is exposed through a first pad contact hole 158a, which penetrates the interlayer insulation layer 116.

The pad upper electrode 156 is electrically connected to the pad intermediate electrode 154, which is exposed through a second pad contact hole 158b, which penetrates a protective layer 118. In addition, the pad upper electrode 154 is exposed outward to be brought into contact with a circuit transmission film, which is connected to a drive circuit. Here, the pad upper electrode 156 is formed on the protective layer 118 using a metal having strong corrosion resistance and acid resistance, which may prevent the pad upper electrode 156 from being corroded by, for example, external moisture even if the pad upper electrode 156 is exposed outward. For example, the pad upper electrode 156 is formed in a stacked structure of an opaque conductive layer Cu and a transparent conductive layer ITO.

The active area AA displays an image via a unit pixel including light-emitting elements 130. The unit pixel includes red, green and blue sub-pixels R, G and B, or includes red, green, blue and white sub-pixels R, G, B and W. Each sub-pixel includes the light-emitting element 130 and a pixel drive circuit that independently drives the light-emitting element 130.

The pixel drive circuit includes a switching transistor T1, a driving transistor T2, and a storage capacitor Cst.

The switching transistor T1 is turned on when a scan pulse signal is supplied to the scan line SL, thereby supplying a data signal, supplied to the data line DL, to the storage capacitor Cst and to a gate electrode of the driving transistor T2.

The driving transistor T2 controls current I, which is supplied from the high-voltage (VDD) supply line to the light-emitting element 130, in response to the data signal supplied to the gate electrode thereof, thereby adjusting the amount of light emitted from the light-emitting element 130. In addition, even if the switching transistor T1 is turned off, the driving transistor T2 supplies a constant amount of current I using a voltage charged in the storage capacitor Cst until a data signal of a next frame is supplied, thereby maintaining continuous emission of light from the light-emitting element 130.

To this end, the driving transistor T2, as illustrated in FIG. 2, includes the gate electrode 106, the source electrode 108, the drain electrode 110, and an active layer 114.

The gate electrode 106 is formed on the gate insulation pattern 112, which has the same pattern as the gate electrode 106. The gate electrode 106 overlaps a channel area 114C of the active layer 114 with the gate insulation pattern 112 interposed therebetween. The gate electrode 106 may be a single layer or multiple layers formed of any one or more selected from among molybdenum (Mo), aluminum (Al), chrome (Cr), gold (Au), titanium (Ti), nickel (Ni), neodymium (Nd), and copper (Cu), or an alloy thereof, without being limited thereto. For example, the gate electrode 106 may have a multilayered structure in which Cu and MoTi are stacked in sequence.

The source electrode 108 is connected to a source area 114S of the active layer 114 through a source contact hole 124S, which penetrates the interlayer insulation layer 116. The drain electrode 110 is connected to a drain area 114D of the active layer 114 through a drain contact hole 124D, which penetrates the interlayer insulation layer 116. In addition, the drain electrode 110 is exposed through a pixel contact hole 120, which penetrates the protective layer 118 and a planarization layer 126, to be connected to an anode electrode 132.

The source electrode 108 and the drain electrode 110 may be a single layer or multiple layers formed of any one or more selected from among molybdenum (Mo), aluminum (Al), chrome (Cr), gold (Au), titanium (Ti), nickel (Ni), neodymium (Nd), and copper (Cu), or an alloy thereof, without being limited thereto.

The active layer 114 includes the source area 114S and the drain electrode 114D, which face each other with the channel area 114C interposed therebetween. The channel area 114C overlaps the gate electrode 106 with the gate insulation pattern 112 interposed therebetween. The source area 114S is connected to the source electrode 108 through the source contact hole 124S, and the drain area 114D is connected to the drain electrode 110 through the drain contact hole 124D. Each of the source area 114S and the drain area 114D is formed of a semiconductor material into which an n-type or p-type dopant is introduced, and the channel area 114C is formed of a semiconductor material into which no n-type or p-type dopant is introduced.

A buffer layer 104 and a light-shielding layer 102 are formed between the active layer 114 and a substrate 101. The light-shielding layer 102 is formed on the substrate 101 to overlap the channel area 114C of the active layer 114. Because the light-shielding layer 102 absorbs or reflects light introduced from the outside, the light-shielding layer 102 may minimize the amount of light introduced into the channel area 114C. Here, the light-shielding layer 102 may be exposed through a light-shielding contact hole 124C, which penetrates the buffer layer 104 and the interlayer insulation layer 116, thereby being electrically connected to the drain electrode 110. The light-shielding layer 102 is formed of an opaque metal such as Mo, Ti, Al, Cu, Cr, Co, W, Ta, or Ni.

The buffer layer 104 is formed on the substrate 101, which is formed of a plastic resin such as, for example, glass or polyimide (PI), using oxide silicon or nitride silicon into a single layer structure or a multilayered structure. The buffer layer 104 serves to prevent the diffusion of moisture or a foreign substance generated in the substrate 101 or to adjust the transfer rate of heat upon crystallization, thereby facilitating the crystallization of the active layer 114.

The storage capacitor Cst includes first and second storage capacitors, which are connected in parallel with each other. The first storage capacitor is formed such that a storage lower electrode 142 and a storage intermediate electrode 144 overlap each other with the buffer layer 104 interposed therebetween, and the second storage capacitor is formed such that the storage intermediate electrode 144 and a storage upper electrode 146 overlap each other with the interlayer insulation layer 116 interposed therebetween. Here, the storage lower electrode 142 is formed in the same layer as the light-shielding layer 102 using the same material as the light-shielding layer 102, the storage intermediate electrode 144 is formed in the same layer as the gate electrode 106 using the same material as the gate electrode 106, and the storage upper electrode 146 is formed to extend from the drain electrode 108. Using the voltage charged in the storage capacitor Cst, even if the switching transistor T1 is turned off, the driving transistor T2 supplies a constant amount of current until a data signal of a next frame is supplied, thereby maintaining continuous emission of light from the light-emitting element 130.

The light-emitting element 130 includes the anode electrode 132 connected to the drain electrode 110 of the driving transistor T2, at least one organic light-emitting layer 134 formed on the anode electrode 132, and a cathode electrode 136 formed on the organic light-emitting layer 134 to be connected to the low-voltage supply line 160. Here, the low-voltage supply line 160 supplies a voltage VSS lower than the high voltage VDD supplied via the high-voltage supply line.

The anode electrode 132 is brought into contact with the drain electrode 110, which is exposed through the pixel contact hole 120, which penetrates the protective layer 118 and the planarization layer 126. The anode electrode 132 is disposed on the planarization layer 126 to be exposed through a bank hole 138, which penetrates a bank 140. The anode electrode 132 is formed as a multilayered structure, which includes a transparent conductive layer and an opaque conductive layer having high reflection efficiency when applied to a top-emission-type organic light-emitting display device. The transparent conductive layer is formed of a material having a relatively large work function value, such as indium-tin-oxide (ITO) or indium-zinc-oxide (IZO), and the opaque conductive layer is formed as a single-layer structure or a multi-layered structure including Al, Ag, Cu, Pb, Mo, Ti or an alloy thereof. For example, the anode electrode 132 is formed such that a transparent conductive layer, an opaque conductive layer, and a transparent conductive layer are sequentially stacked one above another. Because the anode electrode 132, which includes the opaque conductive layer, overlaps the pixel drive circuit, a circuit area CA in which the pixel drive circuit is disposed may also be used as a light-emitting area, which may increase an aperture ratio.

The organic light-emitting layer 134 is formed on the anode electrode 132 by stacking a hole-related layer, a light-emitting layer, and an electron-related layer in this sequence or in the inverse sequence.

The cathode electrode 136 is formed on the upper surface and the side surface of the organic light-emitting layer 134 and the bank 140 to face the anode electrode 132 with the organic light-emitting layer 134 interposed therebetween. The cathode electrode 136 is formed of a transparent conductive layer, such as indium-tin-oxide (ITO) or indium-zinc-oxide (IZO), when applied to a top-emission-type organic light-emitting display device.

In addition, the cathode electrode 136 is connected to the low-voltage supply line 160 via an auxiliary connection electrode 166. The auxiliary connection electrode 166 is electrically connected to the low-voltage supply line 160, which is exposed through a second auxiliary contact hole 170. Here, because the low-voltage supply line 160 is formed of a metal having higher conductivity than that of the cathode electrode 136, the low-voltage supply line 160 may compensate for the high resistance of the cathode electrode 136, which is formed of a transparent conductive layer such as ITO or IZO.

Here, the low-voltage supply line 160 includes first and second low-voltage supply lines 162 and 164, which are connected to each other through a first auxiliary contact hole 168. The first low-voltage supply line 162 is formed on the substrate 101 in the same plane as the light-shielding layer 102 using the same material as the light-shielding layer 102. The second low-voltage supply line 164 is formed on the interlayer insulation layer 116 in the same plane as the source and drain electrodes 108 and 110 using the same material as the source and drain electrodes 108 and 110. The second low-voltage supply line 164 is connected to the first low-voltage supply line 162, which is exposed through the first auxiliary contact hole 168, which penetrates the buffer layer 104 and the interlayer insulation layer 116.

In addition, the second low-voltage supply line 164 of the low-voltage supply line 160 is exposed through the second auxiliary contact hole 170, which penetrates the protective layer 118 and the planarization layer 126, to be connected to the auxiliary connection electrode 166. Meanwhile, although a structure in which the low-voltage supply line 160 is formed as a multilayered structure has been described above by way of example, the low-voltage supply line 160 may be formed as a single-layer structure. The low-voltage supply line 160 having a single-layer structure may be formed simultaneously with any one of the light-shielding layer 102, the gate electrode 106, and the source electrode 108 using the same material as the same.

Meanwhile, in the present disclosure, the organic light-emitting layers 134, which are disposed between neighboring sub-pixels, more particularly between neighboring sub-pixels that realize different colors are separated from each other via at least one protrusion 172.

Figure 3A:
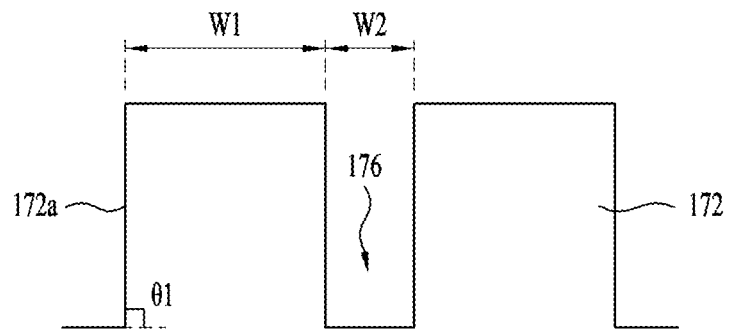
FIGS. 3A to 3C are cross-sectional views illustrating various embodiments of a protrusion illustrated in FIG. 2.
Figure 3B:
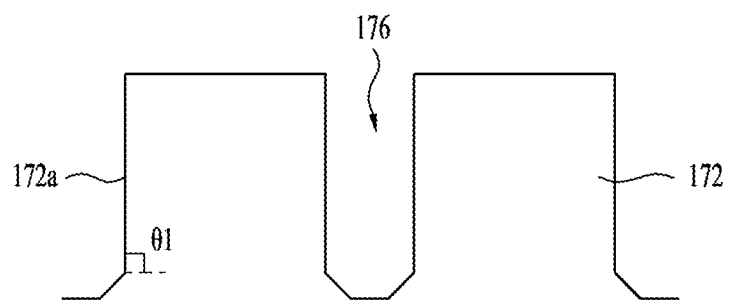
Figure 3C:
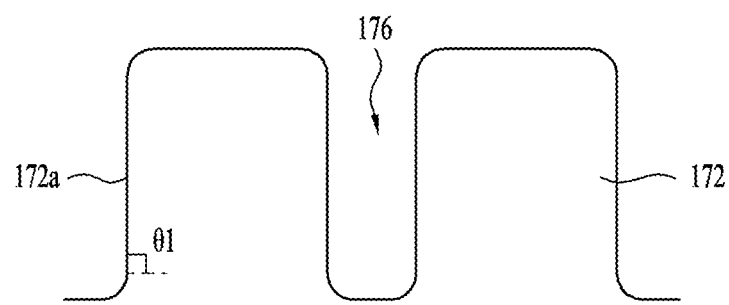

The protrusion 172 overlaps the auxiliary connection electrode 166, which is connected to the low-voltage supply line 160. The protrusion 172 is integrally formed with the planarization layer 126 on the planarization layer 126 using the same material as the planarization layer 126. The protrusion 172 has a thickness greater than that of the organic light-emitting layer 134 and substantially vertically protrudes toward the cathode electrode 136. At least a portion of the side surface of the protrusion 172, as illustrated in FIGS. 3A to 3C, is formed to have a vertical surface 172a, which is orthogonal to the upper surface of the protrusion 172. The protrusion 172 illustrated in FIG. 3A is formed such that the entire side surface of the protrusion 172 is configured with the vertical surface 172a, the protrusion 172 illustrated in FIG. 3B is formed such that the side surface of the protrusion 172 excluding a lower portion is configured with the vertical surface 172a, and the protrusion 172 illustrated in FIG. 3C is formed such that the side surface of the protrusion 172 excluding an upper portion and a lower portion is configured with the vertical surface 172a. In this case, the protrusion 172 has a side surface angle θ1, which is different from an angle θ2 of a side surface of the planarization layer 126, which is exposed through any one of the pixel contact hole 120 and the auxiliary contact hole 170. That is, the protrusion 172 has a side surface angle θ1, which is greater than angle θ2 of a side surface of the planarization layer 126, which is exposed through any one of the pixel contact hole 120 and the auxiliary contact hole 170. For example, because the side surface angle θ2 between the side surface of the planarization layer 126, which is exposed through the pixel contact hole 120, and the upper surface of the protective layer 118 is an acute angle, the planarization layer 126 has a forward tapered shape, the width of which increases from the top to the bottom thereof. In addition, because the side surface angle θ1 between the vertical surface 172a of the protrusion 172 and the upper surface of the planarization layer 126 is substantially a right angle, the protrusion 172 has a vertical cross section having a constant width from the top to the bottom thereof.

In this case, the auxiliary connection electrode 166, which is deposited to exhibit a diffraction property, has good step coverage, and thus is formed on the side surface and the upper surface of the protrusion 172. On the other hand, the organic light-emitting layer 134, which is deposited smoothly in a straight form, has poor step coverage, and thus is formed on the upper surface of the auxiliary connection electrode 166, rather than being formed on the side surface of the auxiliary connection electrode 166 to cover the side surface of the protrusion 172. Thus, the organic light-emitting layers 134 of neighboring sub-pixels are separated on the side surface of the auxiliary connection electrode 166, and a space required for the connection of the auxiliary connection electrode 166 and the cathode electrode 136 is secured. Here, because the cathode electrode 136 has better step coverage than the organic light-emitting layer 134 and is also formed on the side surface of the auxiliary connection electrode 166, the cathode electrode 136 is brought into contact with the side surface of the auxiliary connection electrode 166, which is exposed by the organic light-emitting layer 134.

In particular, because the contact area between the auxiliary connection electrode 166, which is disposed on the protrusion 172, and the cathode electrode 136 increases as the number of protrusions 172 increases, two or more protrusions 172 may be formed. In this case, a recess 176 is formed between the protrusions 172. Because the width W2 of the recess 176, as illustrated in FIGS. 3A to 3C, is smaller than the width W1 of the protrusion 172, it is possible to minimize the deposition of the organic light-emitting layer 134 in the recess 176. Thus, even if the organic light-emitting layer 134 is deposited on the outer surface of the auxiliary connection electrode 166, which is formed on the outermost protrusion 172, it is possible to prevent the organic light-emitting layer 134 from being deposited on the inners surface of the auxiliary connection electrodes 166, which face each other with the recess 176 interposed therebetween.

In this manner, in the organic light-emitting display device according to the first embodiment of the present disclosure, the side surface of the protrusion 172 is substantially vertically formed so that the side surface angle θ1 of the protrusion 172 is greater than angle θ2 of the side surface of the planarization layer 126, which is exposed through the pixel contact hole 120. In this case, in the organic light-emitting display device of the present disclosure, because the organic light-emitting layer 134 is not formed on an upper portion of the side surface of the protrusion 172 even when no partition is provided, the auxiliary connection electrode 166, which is formed on the side surface of the protrusion 172, and the cathode electrode 136 are electrically connected to each other.

Thus, in the organic light-emitting display device of the present disclosure, the number of mask processes for forming a partition may be reduced by at least one, which may simplify the structure and the manufacturing process of the organic light-emitting display device.

Figure 4:
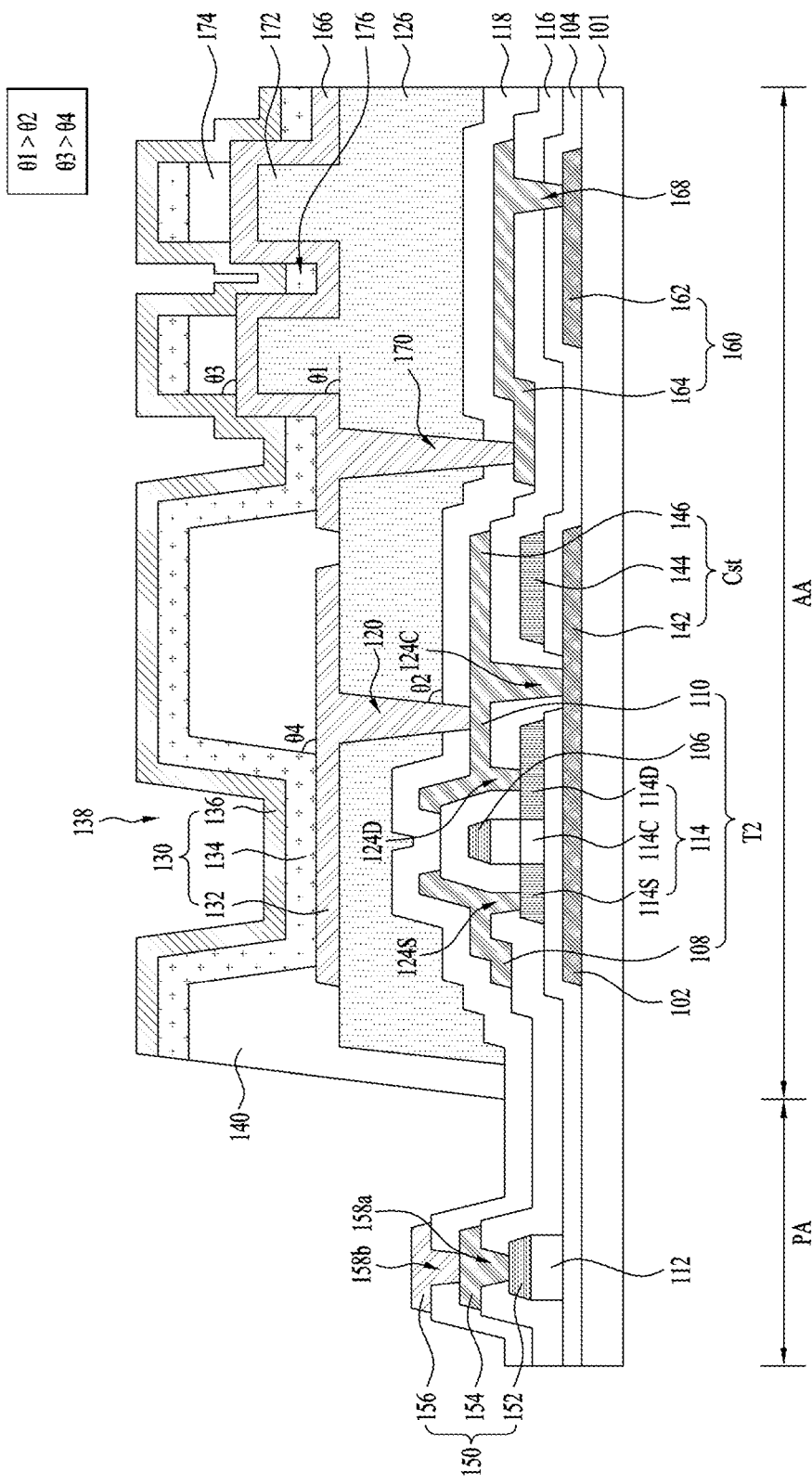
FIG. 4 is a cross-sectional view illustrating an organic light-emitting display device according to a second embodiment of the present disclosure.

FIG. 4 is a cross-sectional view illustrating an organic light-emitting display device according to a second embodiment of the present disclosure.

The organic light-emitting display device illustrated in FIG. 4 includes the same elements as those of the organic light-emitting display device according to the first embodiment of the present disclosure, except that it further includes a second protrusion 174. Thus, a detailed description related to elements that are the same will be omitted.

The first protrusion 172 is integrally formed with the planarization layer 126 on the planarization layer 126 using the same material as the planarization layer 126 to overlap the auxiliary connection electrode 166, which is connected to the low-voltage supply line 160. The first protrusion 172 substantially vertically protrudes toward the cathode electrode 136 in the thickness direction of the substrate 101. At least a portion of the side surface of the first protrusion 172, as illustrated in FIGS. 3A to 3C, forms the vertical surface 172a, which is orthogonal to the upper surface of the first protrusion 172.

The second protrusion 174 is formed through the same mask process as the bank 140, and is disposed on the auxiliary connection electrode 166 using the same material as the bank 140. The second protrusion 174 overlaps the first protrusion 172 with the auxiliary connection electrode 166 interposed therebetween. The second protrusion 174 substantially vertically protrudes toward the cathode electrode 136 in the thickness direction of the substrate 101, in the same manner as the first protrusion 172. The side surface of the second protrusion 174 has a vertical surface, which is orthogonal to the upper surface of the second protrusion 174.

In this case, the second protrusion 174 has a side surface angle θ3, which is greater than angle θ4 of a side surface of the bank 140, which is exposed by a bank hole 138. Because the side surface angle θ4 between the side surface of the bank 140, which is exposed through the bank hole 138, and the upper surface of the anode electrode 132 is an acute angle, the bank 140 formed on the anode electrode 132 has a forward tapered shape, the width of which increases from the top to the bottom. In addition, because the side surface angle θ3 between the side surface of the second protrusion 174 and the upper surface of the auxiliary connection electrode 166 is substantially a right angle, the second protrusion 174 has a vertical cross section having a constant width from the top to the bottom.

In this case, the auxiliary connection electrode 166, which is deposited to exhibit a diffraction property, has good step coverage, and thus is formed on the side surface and the upper surface of the first protrusion 172. On the other hand, the organic light-emitting layer 134, which is deposited smoothly in a straight form, has poor step coverage, and thus is formed on the upper surface of the second protrusion 174, rather than being formed on the side surface of the auxiliary connection electrode 166 to cover the side surface of the first protrusion 172. Thus, the organic light-emitting layers 134 of neighboring sub-pixels are separated on the side surface and the upper surface of the auxiliary connection electrode 166, and a space required for the connection of the auxiliary connection electrode 166 and the cathode electrode 136 is secured. Here, because the cathode electrode 136 has better step coverage than the organic light-emitting layer 134 and is also formed on the side surface of the auxiliary connection electrode 166, and the upper surface of the auxiliary connection electrode 166, which is exposed by the second protrusion 174, the cathode electrode 136 is brought into contact with the side surface and the upper surface of the auxiliary connection electrode 166, which is exposed by the organic light-emitting layer 134.

In particular, because the contact area between the auxiliary connection electrode 166 and the cathode electrode 136 increases as the number of first and second protrusions 172 and 174 increases, two or more first protrusions 172 and two or more second protrusions 174 may be formed.

In this manner, in the organic light-emitting display device according to the second embodiment of the present disclosure, the side surface of the first protrusion 172, which is integrated with the planarization layer 126, and the side surface of the second protrusion 174, which is formed simultaneously with the bank 140 using the same material as the bank 140, are substantially vertically formed. In this case, in the organic light-emitting display device of the present disclosure, because the organic light-emitting layer 134 is not formed on the side surfaces of the first and second protrusions 172 and 174 even when no partition is provided, the auxiliary connection electrode 166, which is formed on the side surfaces of the first and second protrusions 172 and 174, and the cathode electrode 136 are electrically connected to each other. Thus, in the organic light-emitting display device of the present disclosure, a mask process of forming a partition may be reduced by at least one time, which may simplify the structure and the manufacturing process of the organic light-emitting display device.

FIGS. 5A to 5G are cross-sectional views illustrating a method of manufacturing the organic light-emitting display device illustrated in FIG. 4.

Figure 5A:
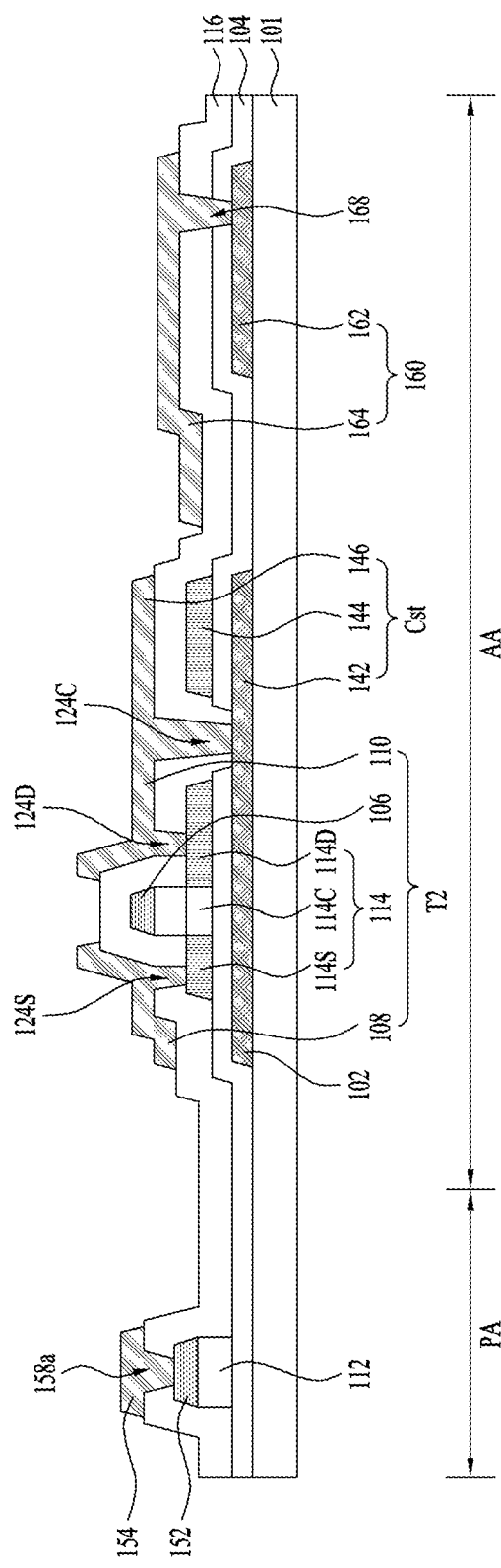
FIGS. 5A to 5G are cross-sectional views illustrating a method of manufacturing the organic light-emitting display device illustrated in FIG. 4.

Referring to FIG. 5A, the light-shielding layer 102, the switching transistor T1, the driving transistor T2, the storage capacitor Cst, the low-voltage supply line 160, the pad lower electrode 152, and the pad intermediate electrode 154 are formed on the substrate 101 through a maximum of five mask processes.

Specifically, the light-shielding layer 102, the storage lower electrode 142, and the first low-voltage supply line 162 are formed on the substrate 101 via a first mask process. Here, the light-shielding layer 102 and the first low-voltage supply line 162 are formed into a single layer using a metal such as Mo, Ti, Cu, AlNd, Al, Cr, or an alloy thereof, or is formed as a multilayered structure using the same. The buffer layer 104 is formed on the substrate 101, on which the light-shielding layer 102 and the first low-voltage supply line 162 have been formed, and the active layer 114 and the storage intermediate electrode 144 are formed on the buffer layer 104 via a second mask process. Subsequently, via a third mask process, the gate insulation pattern 112 is formed on the buffer layer 104, on which the active layer 114 and the storage intermediate electrode 144 have been formed, and simultaneously, the gate electrode 106 and the pad lower electrode 152 are formed on the gate insulation pattern 112. Subsequently, the interlayer insulation layer 116, which has therein the source and drain contact holes 124S and 124D, the storage contact hole 124C, the first pad contact hole 158, and the first auxiliary contact hole 168, is formed on the substrate 101, on which the gate electrode 106 and the pad lower electrode 152 have been formed, via a fourth mask process. Subsequently, the source electrode 108, the drain electrode 110, the storage upper electrode 146, the pad intermediate electrode 154, and the second low-voltage supply line 164 are formed on the substrate 101, on which the interlayer insulation layer 166 has been formed, via a fifth mask process.

Figure 5B:
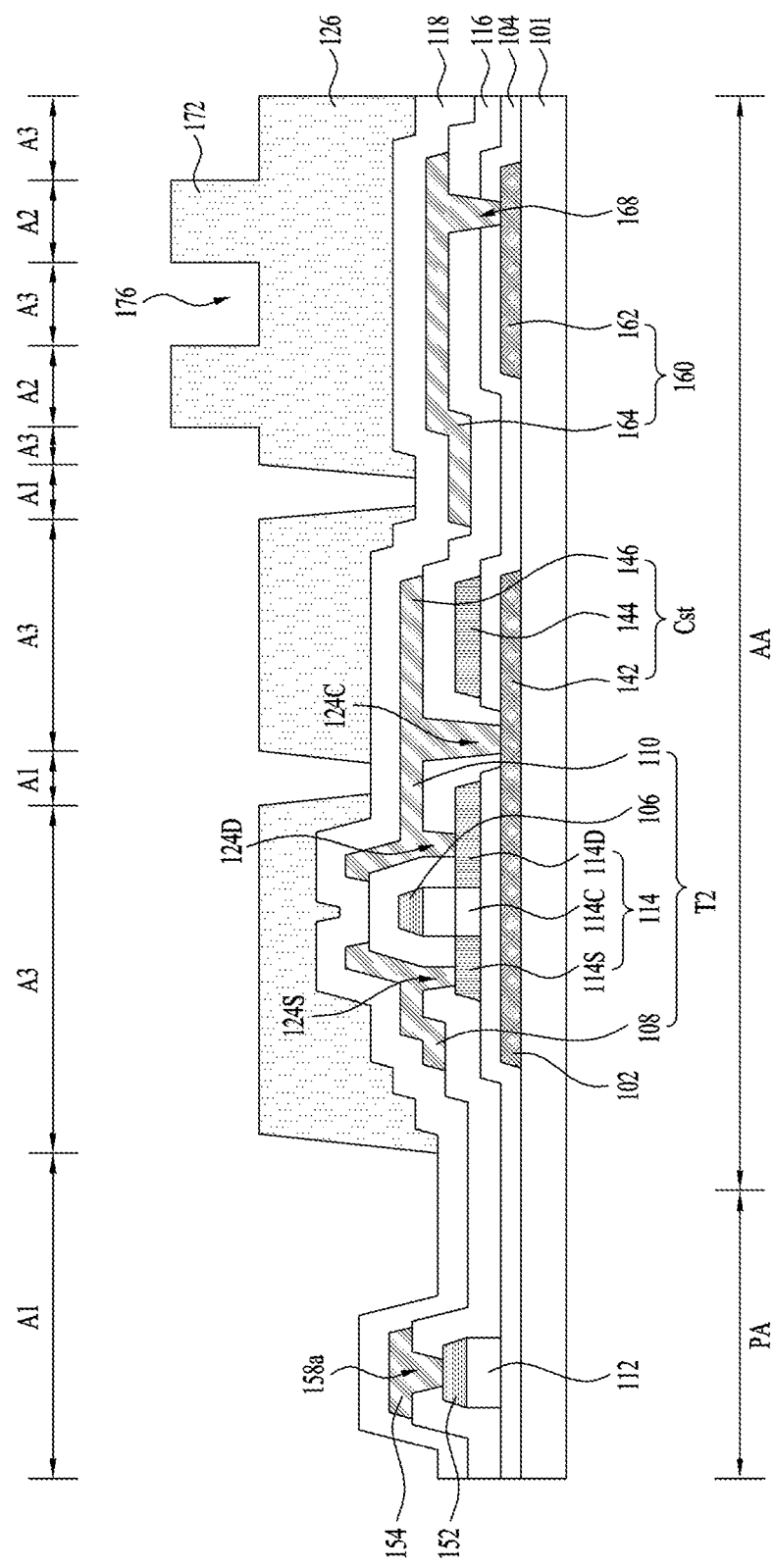
Figure 6A:
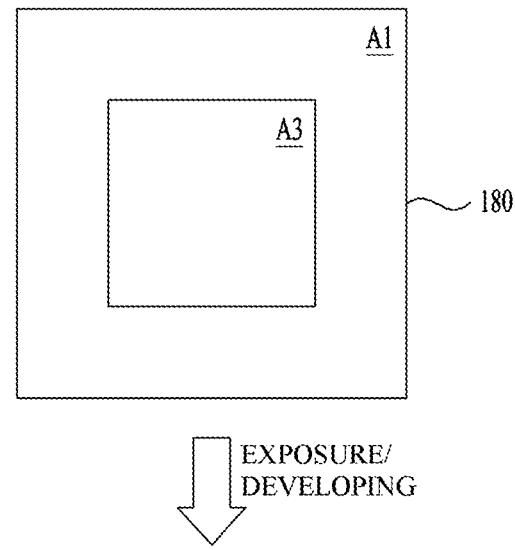
FIGS. 6A and 6B are views for concretely explaining a method of manufacturing a planarization layer having a protrusion illustrated in FIG. 5B.
Figure 6A:
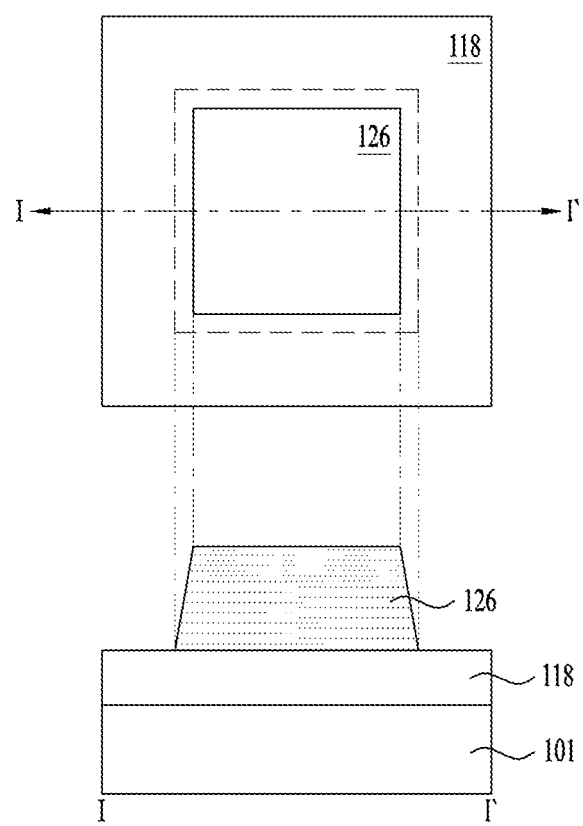
Figure 6B:
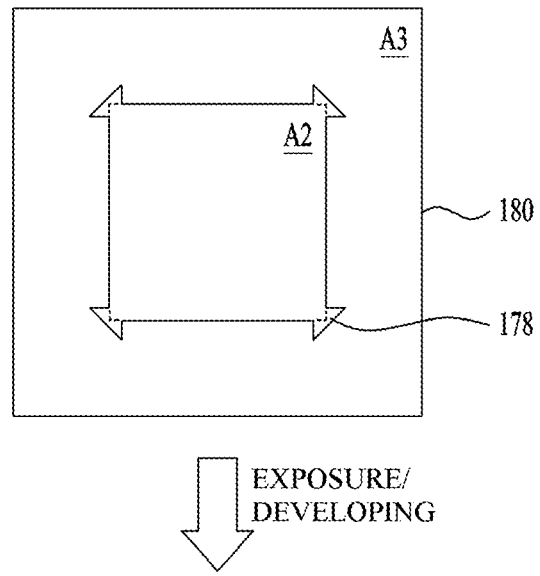
Figure 6B:
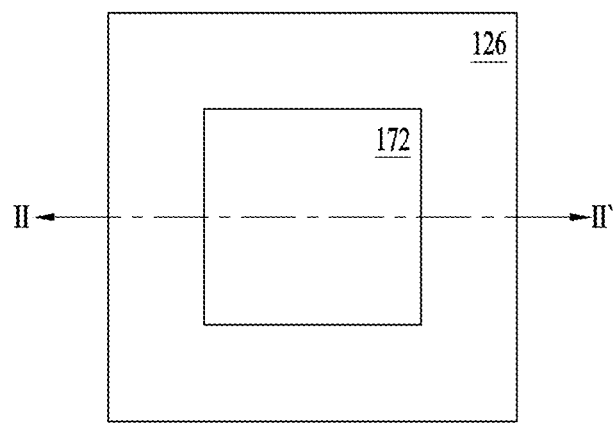
Figure 6B:
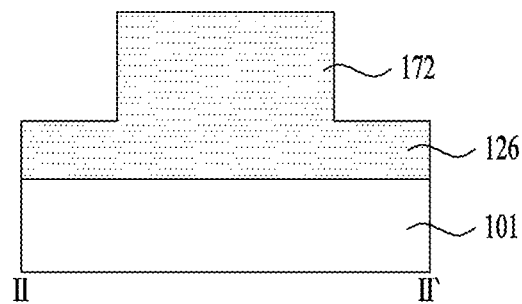

Subsequently, as illustrated in FIG. 5B, the protective layer 118 and the planarization layer 126 are sequentially stacked on the interlayer insulation layer 116, on which the source electrode 108, the drain electrode 110, the storage upper electrode 146, the pad intermediate electrode 154, and the second low-voltage supply line 164 have been formed. Here, the protective layer 118 is formed of an inorganic insulation material such as, for example, SiOx or SiNx, and the planarization layer 126 is formed of a photosensitive organic insulation material such as, for example, photoacryl. Subsequently, the planarization layer 126 is patterned via exposure and developing processes using a sixth mask 180, which includes a light-shielding area A1, a translucent area A3, and a transparent area A2, so that the planarization layer 126 having the first protrusion 172 is formed. The light-shielding area A1 of the sixth mask 180, as illustrated in FIG. 6A, is a light-shielding area and is disposed in an area in which the planarization layer 126 is removed to expose the protective layer 118. The translucent area A3 of the sixth mask 180 is an area, the light-shielding amount of which is smaller than that of the light-shielding area A1, but is greater than that of the transparent area A2, and is disposed in the area in which the planarization layer 126 is formed. The side surface of the planarization layer 126, which corresponds to the translucent area A3, as illustrated in FIG. 6A, is distorted and obliquely formed, unlike the original shape of the translucent area A3, due to the effect of diffraction and interference of light during an exposure process. A correction pattern 178 is disposed, as illustrated in FIG. 6B, on the corner of the transparent area A2 of the sixth mask 180 for optical proximity correction (OPC). The correction pattern 178 corrects distortion due to the diffraction and interference of light during an exposure process so that the side surface of the first protrusion 172 is substantially vertically formed to correspond to the shape of the transparent area A2.

Figure 5C:
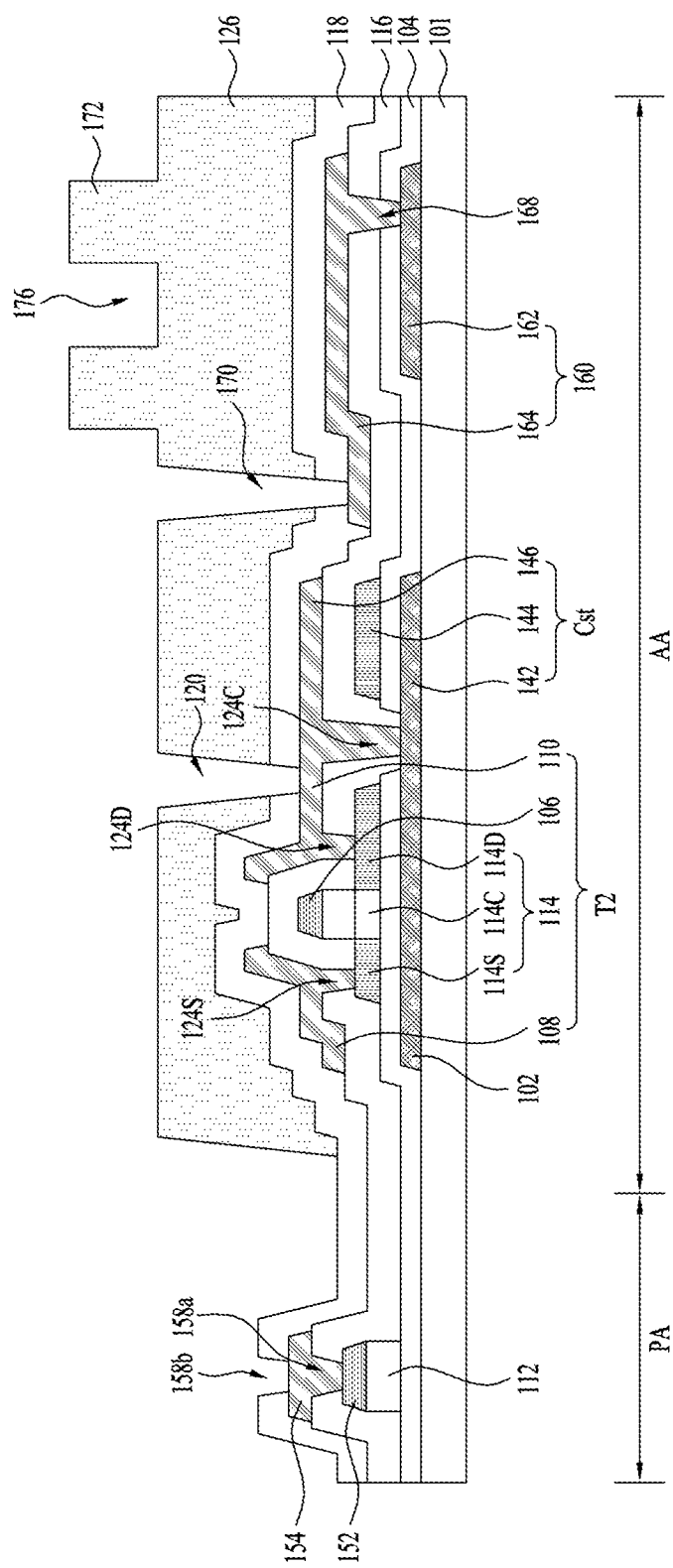

Subsequently, the protective layer 118, which is located under the planarization layer 126 having the first protrusion 172, is patterned via a photolithography process and an etching process using a seventh mask, as illustrated in FIG. 5C, so that the pixel contact hole 120, the auxiliary contact hole 170, and the second pad contact hole 158b are formed.

Figure 5D:
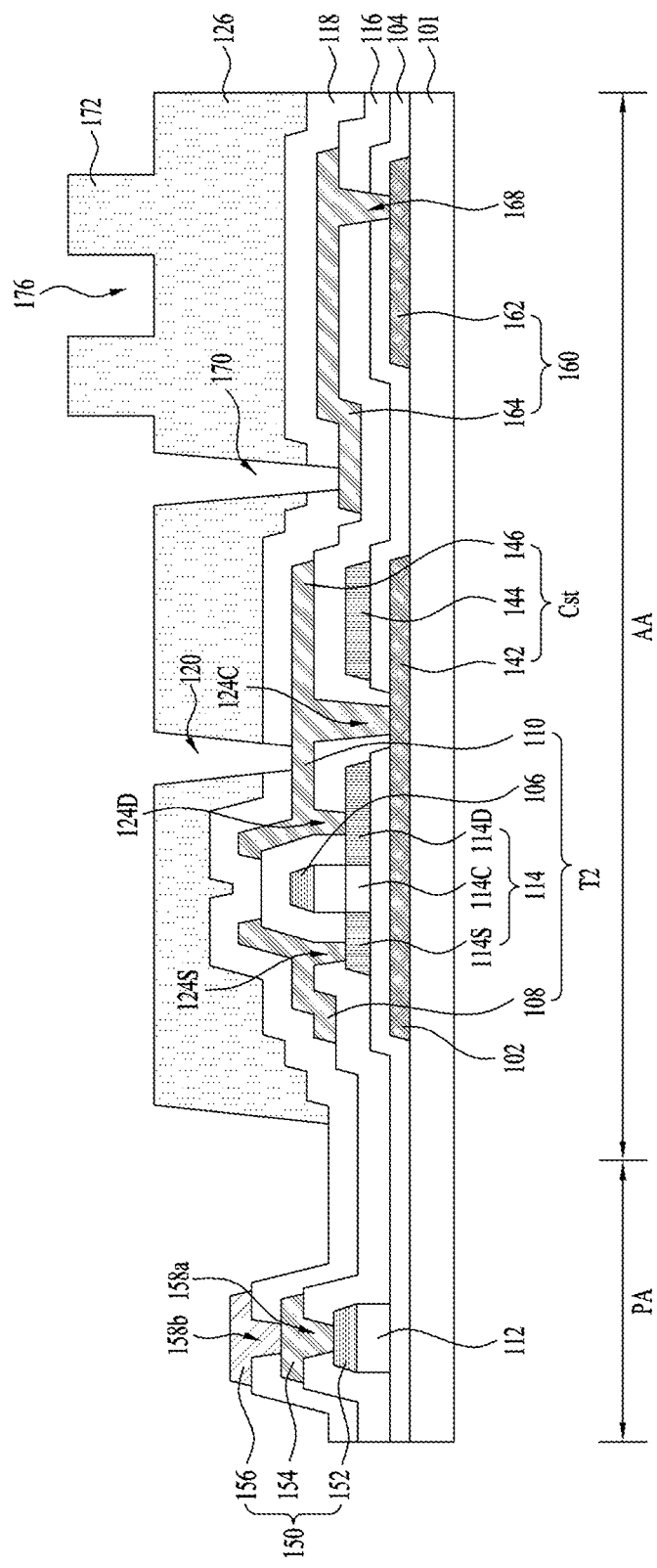

Subsequently, after a pad conductive layer is deposited over the entire surface of the substrate 101 in which the pixel contact hole 120, the auxiliary contact hole 170, and the second pad contact hole 158b are formed, the pad conductive layer is patterned via a photolithography process and an etching process using an eighth mask, as illustrated in FIG. 5D, so that the pad upper electrode 156 is formed.

Figure 5E:
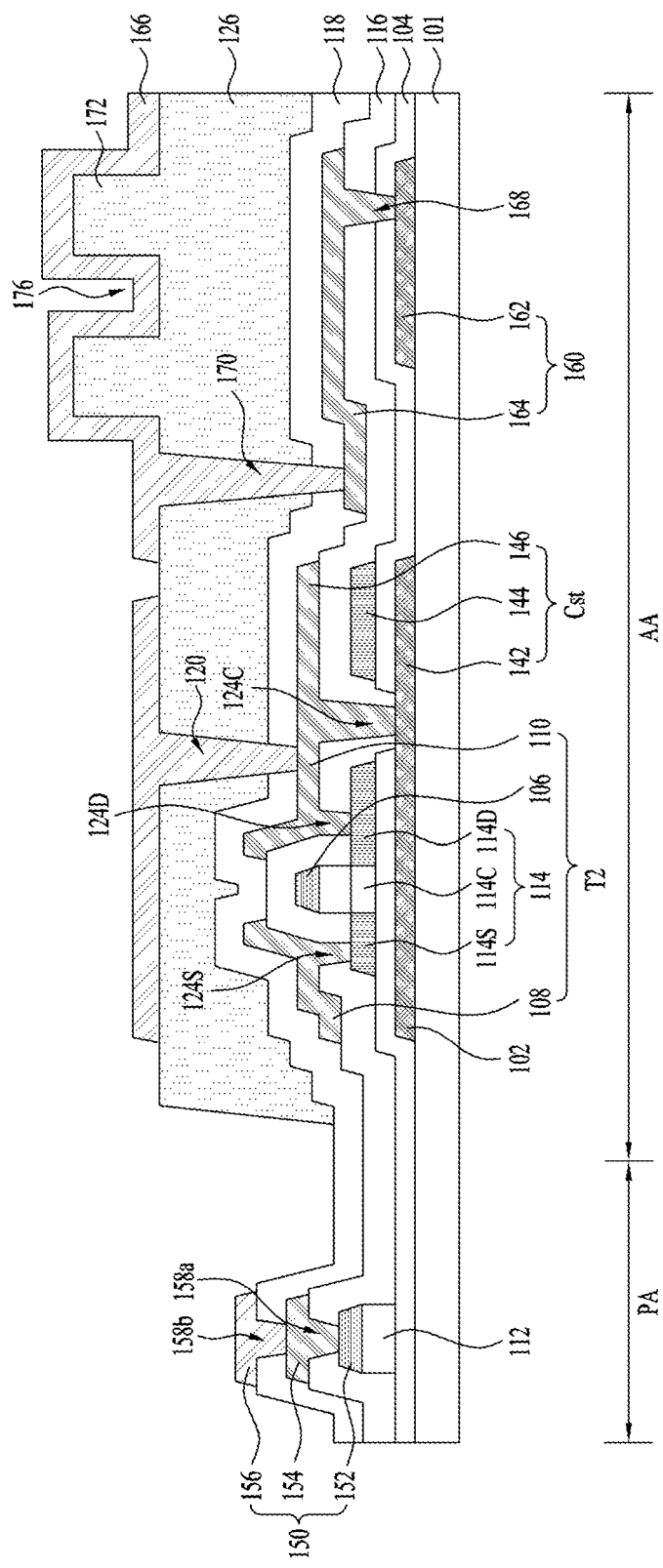

After an anode conductive layer is deposited over the entire surface of the substrate 101 on which the pad upper electrode 156 has been formed, the anode conductive layer is patterned via a photolithography process and an etching process using a ninth mask, as illustrated in FIG. 5E, so that the anode electrode 132 and the auxiliary connection electrode 168 are formed.

Figure 5F:
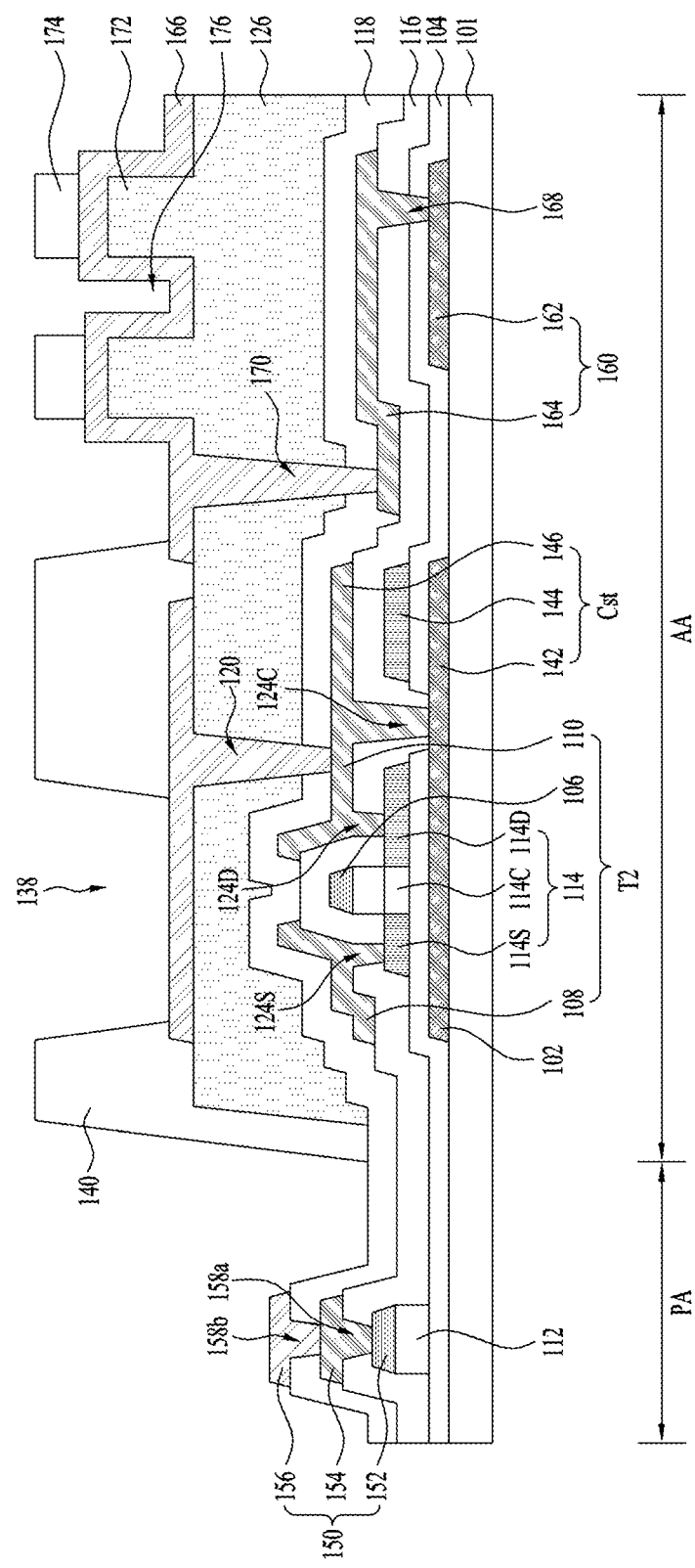

After a photosensitive organic layer is applied to the entire surface of the substrate 101, on which the anode electrode 132 and the auxiliary connection electrode 168 have been formed, the photosensitive organic layer is patterned via a photolithography process using a tenth mask, as illustrated in FIG. 5F, so that the bank 140 and the second protrusion 174 are formed.

Figure 5G:
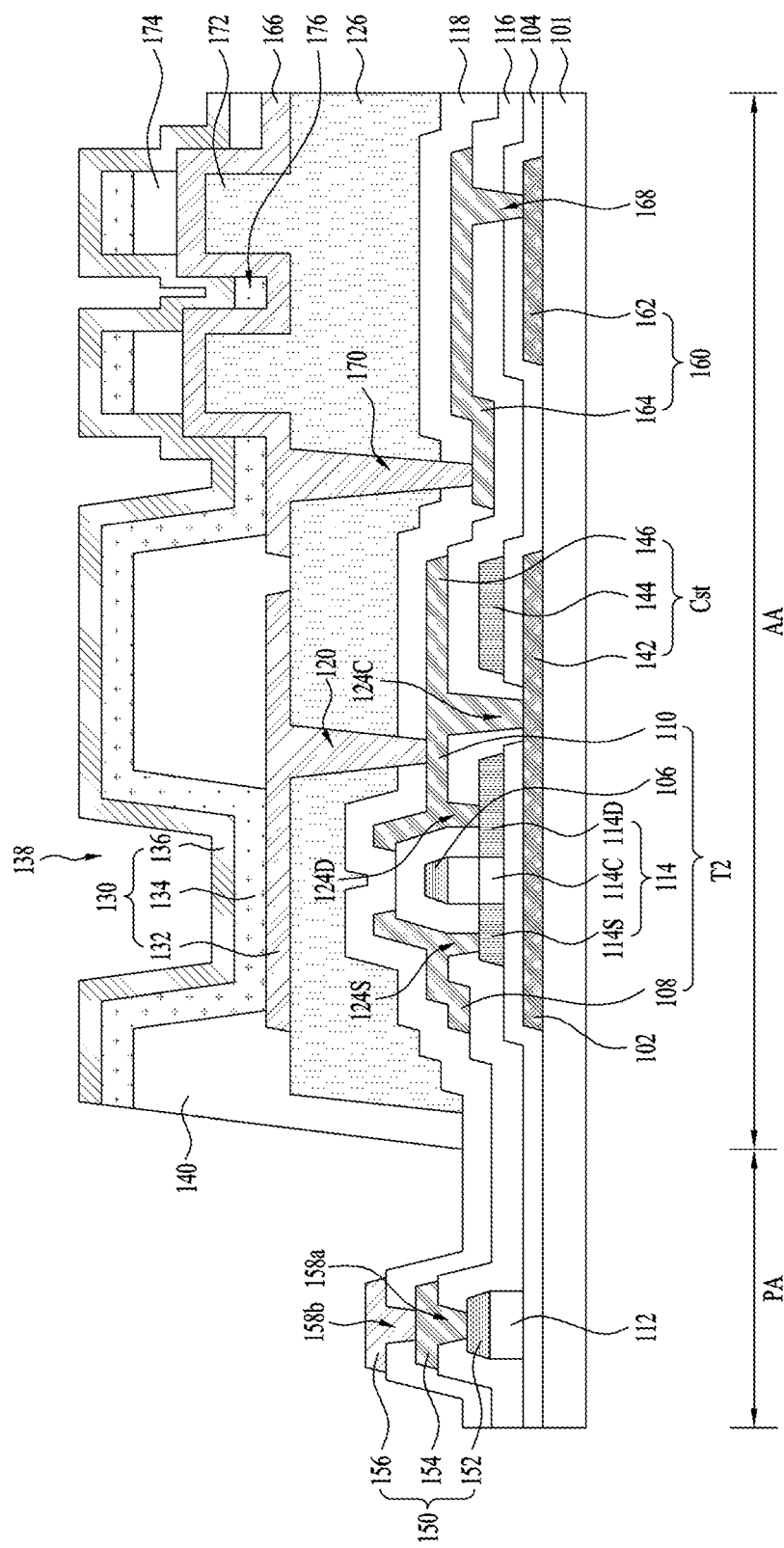

As illustrated in FIG. 5G, the organic light-emitting layer 134 and the cathode electrode 136 are sequentially formed, as illustrated in FIG. 5G, on the substrate 101, on which the bank 140 and the second protrusion 174 have been formed, via a deposition process using a shadow mask. At this time, the organic light-emitting layer 134, which is formed smoothly in a straight form in the vertical direction, is not formed on the side surfaces of the first and second protrusions 172 and 174, and the cathode electrode 136, which is formed to exhibit a diffraction property in the vertical direction, the horizontal direction, and the oblique direction, is formed on the side surfaces of the first and second protrusions 172 and 174.

As described above, because the organic light-emitting layer 134 is not formed on the side surfaces of the first and second protrusions 172 and 174 even when no partition is provided, the auxiliary connection electrode 166, which is formed on the side surfaces of the first and second protrusions 172 and 174, is electrically connected to the cathode electrode 136. Thus, the organic light-emitting display device according to the present disclosure may simplify the structure and the manufacturing process thereof because a mask process of forming a partition may be omitted, which may increase productivity.

As is apparent from the above description, according to the embodiments of the present disclosure, light-emitting layers of neighboring sub-pixels may be separated by a protrusion formed on a planarization layer without a separate partition, and a cathode electrode and an auxiliary connection electrode may be electrically connected to each other on the side surface of the protrusion. As such, in the present disclosure, a mask process of forming a partition may be omitted, which may simplify the structure and the manufacturing process of an organic light-emitting display device.

Although the embodiments of the present disclosure have been described above in detail with reference to the accompanying drawings, it will be apparent to those skilled in the art that the present disclosure described above is not limited to the embodiments described above, and various substitutions, modifications, and alterations may be devised within the spirit and scope of the present disclosure. Accordingly, various embodiments disclosed in the present disclosure are not intended to limit the technical sprit of the present disclosure, and the scope of the technical sprit of the present disclosure is not limited by the embodiments.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light-emitting display device comprising:
    a thin-film transistor and a metal line disposed on a substrate;
    a planarization layer having a pixel contact hole configured to expose the thin-film transistor;
    an organic light-emitting element disposed on the planarization layer, the organic light-emitting element including an anode electrode, a cathode electrode and a first organic light-emitting layer;
    a first protrusion spaced apart from the anode electrode of the organic light-emitting element and configured to protrude from the planarization layer toward the cathode electrode of the organic light-emitting element, the first protrusion has a side surface angle different in size from a side surface angle of a side surface of the planarization layer that is exposed through the pixel contact hole; and
    an auxiliary connection electrode disposed on the first protrusion and connected to the cathode electrode and connected to the metal line through an auxiliary contact hole within the planarization layer,
    wherein the first protrusion is disposed on the metal line.

2. The device according to claim 1, wherein the side surface angle of the first protrusion is greater than the side surface angle of the side surface of the planarization layer that is exposed through the pixel contact hole.

3. The device according to claim 1, wherein the first protrusion is integrally formed with the planarization layer using a same material as the planarization layer.

4. The device according to claim 1, wherein the first protrusion has a thickness greater than a thickness of an organic light-emitting layer disposed between the anode electrode and the cathode electrode.

5. The device according to claim 1, further comprising a second protrusion disposed on the auxiliary connection electrode, the second protrusion overlapping the first protrusion.

6. The device according to claim 5, further comprising a bank structure configured to expose the anode electrode and the auxiliary connection electrode,
    wherein the second protrusion is formed of a same material as the bank.

7. The device according to claim 6, comprising at least two second protrusions with a recess interposed therebetween, and
    wherein the recess has a width smaller than a width of at least one of the second protrusions.

8. The device according to claim 5, wherein a side surface of the second protrusion is substantial vertical.

9. The device of claim 6, wherein a side surface angle of the second protrusion is greater than a side surface angle of a side surface of the bank structure.

10. The device according to claim 1, further comprising a low-voltage supply line connected to the cathode electrode via the auxiliary connection electrode.

11. The device according to claim 1, further comprising another organic light-emitting element including a second organic light-emitting layer, wherein the second organic light-emitting layer of the another organic light-emitting element is separated from the first organic light-emitting layer via the first protrusion.

12. The device according to claim 1, comprising at least two first protrusions with a recess interposed therebetween, wherein the recess has a width smaller than a width of at least one of the first protrusions.

13. The device according to claim 1, wherein the side surface angle of the first protrusion is substantial ninety degree.

14. The device according to claim 1, wherein the side surface angle of the side surface of the planarization layer that is exposed through the pixel contact hole is smaller than ninety degree.

15. The device according to claim 1, further comprising:
    a light shielding layer disposed below the thin-film transistor; and
    a storage capacitor overlapping the thin-film transistor.

16. The device according to claim 15, wherein a source electrode and a drain electrode of the thin-film transistor and a storage electrode of the storage capacitor are disposed in a same layer as the metal line.

17. An organic light-emitting display device comprising:
    a transistor and a metal line disposed on a substrate;
    a planarization layer having a pixel contact hole configured to expose the thin-film transistor, an auxiliary contact hole configured to expose the metal line, and a first protrusion;
    an organic light-emitting element disposed on the planarization layer, the organic light-emitting element including an anode electrode, a cathode electrode and an organic light-emitting layer;
    an auxiliary connection electrode disposed on the first protrusion and connected to the metal line through the auxiliary contact hole, the anode electrode being separated from the auxiliary connection electrode, the cathode electrode being connected to the auxiliary connection electrode via a portion of the auxiliary connection electrode that is disposed on an upper portion of at least one of the sidewalls of the first protrusion, and the organic light-emitting layer being terminated at the portion of the auxiliary connection electrode that is connected to the cathode electrode, wherein the first protrusion is disposed on the metal line.

18. The device of claim 17, wherein at least one of the sidewalls of the first protrusion is substantial vertical.

19. A method of manufacturing an organic light-emitting display device, comprising:

forming a thin-film transistor and a metal line disposed on a substrate;

forming a planarization layer, the planarization layer having a pixel contact hole configured to expose the thin-film transistor, an auxiliary contact hole configured to expose the metal line, and a first protrusion configured to protrude from the planarization layer, the first protrusion having a side surface angle different from a side surface angle of a side surface of the planarization layer that is exposed through the pixel contact hole;

forming an auxiliary connection electrode disposed on the first protrusion and connected to the metal line through the auxiliary contact hole, and an anode electrode spaced apart from the auxiliary connection electrode; and forming a cathode electrode that is connected to the auxiliary connection electrode on the side surface of the first protrusion, wherein the first protrusion is disposed on the metal line.

20. The method according to claim 19, wherein the side surface angle of the first protrusion is greater than the side surface angle of the side surface of the planarization layer that is exposed through the pixel contact hole.

21. The method according to claim 20, further comprising forming a bank structure that exposes the anode electrode and the auxiliary connection electrode, and simultaneously forming a second protrusion on the auxiliary connection electrode, the second protrusion overlapping the first protrusion.

22. An organic light-emitting display device comprising:

a thin-film transistor disposed on a substrate;

a planarization layer having a pixel contact hole configured to expose the thin-film transistor;

an organic light-emitting element disposed on the planarization layer, the organic light-emitting element including an anode electrode, a cathode electrode and a first organic light-emitting layer;

a first protrusion spaced apart from the anode electrode of the organic light-emitting element and configured to protrude from the planarization layer toward the cathode electrode of the organic light-emitting element, the first protrusion has a side surface angle different in size from a side surface angle of a side surface of the planarization layer that is exposed through the pixel contact hole;

an auxiliary connection electrode disposed on the first protrusion and connected to the cathode electrode;

a second protrusion disposed on the auxiliary connection electrode, the second protrusion overlapping the first protrusion; and a bank structure configured to expose the anode electrode and the auxiliary connection electrode, the bank being formed of a same material as the second protrusion.

* * * * *